(12) United States Patent
Chang et al.

(10) Patent No.: US 8,416,616 B2
(45) Date of Patent: Apr. 9, 2013

(54) PHASE CHANGE MEMORY DEVICE AND METHOD FOR MANUFACTURING THE SAME

(75) Inventors: Heon Yong Chang, Gyeonggi-do (KR); Myoung Sub Kim, Gyeonggi-do (KR); Gap Sok Do, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 110 days.

(21) Appl. No.: 13/036,916

(22) Filed: Feb. 28, 2011

(65) Prior Publication Data

US 2011/0312149 A1 Dec. 22, 2011

Related U.S. Application Data

(62) Division of application No. 12/100,536, filed on Apr. 10, 2008, now abandoned.

(30) Foreign Application Priority Data

Aug. 9, 2007 (KR) .................. 10-2007-0080302
Mar. 19, 2008 (KR) .................. 10-2008-0025443

(51) Int. Cl.
*G11C 11/00* (2006.01)

(52) U.S. Cl.
USPC .................... 365/163; 365/148; 977/754

(58) Field of Classification Search .......... 365/46, 365/94, 100, 113, 129, 148, 163; 257/2–5, 257/9, 296, 310, E21.35, E31.047, E27.006; 438/29, 95, 96, 166, 135, 240, 259, 365, 438/482, 486, 597, 785; 977/754

See application file for complete search history.

(56) References Cited

U.S. PATENT DOCUMENTS

| | | | | |
|---|---|---|---|---|
| 5,596,522 A | * | 1/1997 | Ovshinsky et al. | 365/113 |
| 6,791,107 B2 | * | 9/2004 | Gill et al. | 257/20 |
| 7,308,067 B2 | * | 12/2007 | Lowrey et al. | 365/185.24 |
| 7,990,761 B2 | * | 8/2011 | Gordon et al. | 365/163 |
| 2003/0116794 A1 | * | 6/2003 | Lowrey | 257/296 |
| 2005/0029502 A1 | * | 2/2005 | Hudgens | 257/4 |
| 2006/0186483 A1 | * | 8/2006 | Cho et al. | 257/390 |
| 2007/0097738 A1 | * | 5/2007 | Asano et al. | 365/163 |
| 2007/0269974 A1 | * | 11/2007 | Park et al. | 438/618 |

* cited by examiner

*Primary Examiner* — Harry W Byrne

(74) *Attorney, Agent, or Firm* — William Park & Associates Ltd.

(57) ABSTRACT

A phase change memory device includes a silicon substrate having a bar-type active region and an N-type impurity region formed in a surface of the active region. A first insulation layer is formed on the silicon substrate, and the first insulation layer includes a plurality of first contact holes and second contact holes. PN diodes are formed in the first contact holes. Heat sinks are formed in the first contact holes on the PN diodes, and contact plugs fill the second contact holes. A second insulation layer having third contact holes is formed on the first insulation layer. Heaters fill the third contact holes. A stack pattern of a phase change layer and a top electrode is formed to contact the heaters. The heat sink quickly cools heat transferred from the heater to the phase change layer.

19 Claims, 4 Drawing Sheets

PHASE CHANGE MEMORY DEVICE AND METHOD FOR MANUFACTURING THE SAME

CROSS-REFERENCE TO RELATED APPLICATIONS

The present application is a divisional of and claims the benefit of the prior nonprovisional application Ser. No. 12/100,536 under 35 U.S.C. 121, which claims priorities to Korean patent application numbers 10-2007-0080302 filed on Aug. 9, 2007 and 10-2008-0025443 filed on Mar. 19, 2008, all of which are incorporated herein by reference in their entireties.

BACKGROUND OF THE INVENTION

The present invention relates to a phase change memory device and a method for manufacturing the same, and more particularly, to a phase change memory device which enables manufacturing of a highly integrated phase change memory device having stable reset resistance and a method for manufacturing the same.

Memory devices are typically classified into two categories: volatile random access memory (RAM), which loses inputted information when power is interrupted; and non-volatile read-only memory (ROM), which can continuously maintain the stored state of inputted information even when power is interrupted. Examples of volatile RAM include dynamic RAM (DRAM) and static RAM (SRAM), and examples of non-volatile ROM include flash memory devices such as an electrically erasable and programmable ROM (EEPROM).

Although DRAM is an excellent memory device, the DRAM requires a high charge storing capacity, which in turn requires the surface area of an electrode to increase. When the surface area of the electrode is increased, high levels of integration become difficult. Further, in flash memory devices, two gates are stacked upon each other. Accordingly, an operation voltage that is higher than a power source voltage is required, and thus. In order to provide the high operation voltage, a separate booster circuit is needed to supply the voltage required for write and delete operations. All of these factors present difficulties when attempting to accomplish high levels of integration.

Under these situations, the so-called phase change memory device drew attention for research in an effort to develop a memory device having a simple configuration that is capable of accomplishing a high level of integration while retaining the characteristics of a non-volatile memory device. In the phase change memory device, a phase change from a crystalline state to an amorphous state occurs in a phase change layer interposed between a bottom electrode and a top electrode due to a current flow between the bottom electrode and the top electrode. The information stored in a cell is recognized utilizing the difference in resistance between the crystalline state and the amorphous state of the phase change layer.

In detail, in the phase change memory device, the phase change layer undergoes a phase change between a set state, being the crystalline state, and a reset state, being the amorphous state. This phase change occurs by heat (that is, Joule heat) generated by an applied current. The resistance of the phase change layer in the amorphous state is higher than the resistance of the phase change layer in the crystalline state, as such whether the information stored in a phase change memory cell has a logic '1' or a logic '0' can be determined by sensing the current flowing through the phase change layer in a read mode.

One of the most important factors when developing a highly integrated phase change memory device is to secure a programming current. One way of securing the programming current includes the utilization of a vertical type PN diode as a switching element.

FIG. 1 is a cross-sectional view showing a conventional phase change memory device which adopts a PN diode.

Referring to FIG. 1, an N-type impurity region 110 is formed on the surface of a silicon substrate 100. A stack pattern 140 of an N-type silicon layer and a P-type silicon layer is formed on the N-type impurity region 110, and the stack pattern 140 and the N-type impurity region 110 constitute a PN diode 150. A heater 170 serving as a bottom electrode is formed on the stack pattern 140 of the N-type silicon layer and the P-type silicon layer, and a phase change layer 180 is formed on the heater 170.

The phase change memory device having the PN diode as a switching element has an improved current flow characteristic compared to a phase change memory device utilizing a CMOS transistor as a switching element. Therefore, in the PN diode phase change memory device it is possible to decrease the cell size when compared to a DRAM or a flash memory device.

In the phase change memory device, when implementing reset programming for changing the phase of the phase change layer from the crystalline state to the amorphous state to allow the phase change layer to have a high reset resistance, the phase change layer undergoes melting and cooling procedures.

In a conventional phase change memory device, the heat generated by the reset current (which is transferred from the heater to the phase change layer) does not cool quickly. If when implementing the reset programming, the cooling of the phase change layer is not done quickly, a portion of the phase change layer will change to a phase between the amorphous state and the crystalline state, and a phenomenon, in which reset resistance decreases, occurs.

Accordingly, in a conventional phase change memory device, when the heat transferred from the heater to the phase change layer is not quickly cooled, the phase change layer will not have a stable reset resistance, resulting in a poor sensing margin in the phase change memory device, and thus concerns emerge regarding the reliability of the conventional phase change memory device.

SUMMARY OF THE INVENTION

The present invention provides a phase change memory device which allows the heat generated by the reset current transmitted to a phase change layer to be quickly cooled and a method for manufacturing the same.

Additionally, the present invention provides a phase change memory device with improved operation characteristics and the reliability and a method for manufacturing the same.

In one aspect, a phase change memory device comprises a heat sink formed between a switching element and a heater to quickly cool heat transferred from the heater to a phase change layer.

The switching element comprises a PN diode.

The heater comprises any one of a TiW layer, a TiAlN layer, and a TiN layer.

The heat sink is formed of tungsten or tungsten silicide.

In another aspect, a phase change memory device comprises a silicon substrate having a bar-type active region and an N-type impurity region formed in a surface of the active region; a first insulation layer formed on the silicon substrate including the N-type impurity region, and having a plurality of grouped first contact holes and second contact holes respectively located between groups of the first contact holes; PN diodes formed in the first contact holes and recessed therein; heat sinks formed on the PN diodes in the first contact holes to completely fill the first contact holes; contact plugs formed to fill the second contact holes; a second insulation layer formed on the first insulation layer including the heat sinks and the contact plugs, and having third contact holes for exposing the heat sinks; heaters formed in the third contact holes; and a stack pattern of a phase change layer and a top electrode contacting each heater.

The first contact holes have a width in the range of 100~1,000 Å.

The first contact holes are separated from one another by a distance in the range of 10~2,000 Å.

The first contact holes are grouped in a number corresponding to a multiple of 2.

Each PN diode comprises a stack pattern of an N-type silicon layer and a P-type silicon layer sequentially formed on the N-type impurity region.

The N-type silicon layer has a concentration lower than the N-type impurity region.

The P-type silicon layer has a concentration higher than

The N-type silicon layer has a concentration in the range of $1 \times 10^{18}$~$1 \times 10^{20}$ ions/cm$^3$, and the P-type silicon layer has a concentration in the range of $1 \times 10^{19}$~$1 \times 10^{22}$ ions/cm$^3$.

The PN diodes are recessed to a depth in the range of 100~3,000 Å when measured from upper ends of the first contact holes.

The phase change memory device further comprises metal silicide layers respectively interposed between the PN diodes and the heat sinks in the first contact holes and between the N-type impurity region and the contact plugs in the second contact holes.

The metal silicide layers comprise Co silicide or Ti silicide.

The phase change memory device further comprises a barrier layer interposed between one metal silicide layer and the heat sinks and between the other metal silicide layer and the contact plugs.

The heat sinks comprise tungsten or tungsten silicide.

The third contact holes have a width in the range of 100~1,000 Å.

The heaters comprise any one of a TiW layer, a TiAlN layer, and a TiN layer.

The stack pattern of the phase change layer and the top electrode is formed in the type of a line extending in a direction perpendicular to a direction of the active region.

The phase change layer is formed of a material containing at least one of Ge, Sb, and Te.

The phase change layer is doped with at least one of oxygen, nitrogen, and silicon.

In still another aspect, a method for manufacturing a phase change memory device comprises the steps of forming a first insulation layer on a silicon substrate having a bar-type active region and an N-type impurity region formed in a surface of the active region; etching the first insulation layer and defining a plurality of grouped first contact holes; forming PN diodes in the first contact holes to be recessed therein; etching the first insulation layer and defining second conduct holes between groups of the first contact holes; forming heat sinks on the PN diodes in the first contact holes and contact plugs in the second contact holes; forming a second insulation layer having third contact holes for exposing the heat sinks on the first insulation layer including the heat sinks and the contact plugs; forming heaters in the third contact holes; and forming a stack pattern of a phase change layer and a top electrode contacting each heater.

The first contact holes are defined to have a width in the range of 100~1,000 Å.

The first contact holes are defined to be separated from one another by a distance in the range of 10~2,000 Å.

The first contact holes are defined to be grouped to have a number corresponding to a multiple of 2.

The second contact holes are defined to have a width greater than the first contact holes.

The PN diodes are formed to be recessed to a depth in the range of 100~3,000 Å when measured from upper ends of the first contact holes.

The PN diodes are formed as a stack pattern of an N-type silicon layer and a P-type silicon layer.

The step of forming the N-type silicon layer and the P-type silicon layer comprises the steps of forming the N-type silicon layer on the N-type impurity region exposed by the first contact holes using a selective epitaxial growth process such that the N-type silicon layer is recessed in the first contact holes; and ion-implanting P-type impurities in an upper portion of the N-type silicon layer to form the P-type silicon layer.

The N-type silicon layer is formed to have a concentration lower than the N-type impurity region.

The N-type silicon layer is formed to have a concentration in the range of $1 \times 10^{18}$~$1 \times 10^{20}$ ions/cm$^3$.

The P-type silicon layer is formed to have a concentration higher than the N-type silicon layer.

The P-type silicon layer is formed to have a concentration in the range of $1 \times 10^{19}$~$1 \times 10^{22}$ ions/cm$^3$.

After the step of defining the second contact holes and before the step of forming the heat sinks and the contact plugs, the method further comprises the step of forming metal silicide layers on the PN diodes in the first contact holes and on the N-type impurity region in the second contact holes.

The metal silicide layers are formed as Co silicide layers or Ti silicide layers.

After the step of forming the metal silicide layers and before the step of forming the heat sinks and the contact plugs, the method further comprises the steps of forming a barrier layer and annealing the barrier layer.

The heat sinks and the contact plugs are formed of tungsten or tungsten silicide.

The third contact holes are defined to have a width in the range of 100~1,000 Å.

The heaters are formed as any one of a TiW layer, a TiAlN layer and a TiN layer.

The stack pattern of the phase change layer and the top electrode is formed in the type of a line extending in a direction perpendicular to the direction of the active region.

The phase change layer is formed of a material comprising at least one of Ge, Sb, and Te.

The phase change layer is doped with at least one of oxygen, nitrogen, and silicon.

DESCRIPTION OF SPECIFIC EMBODIMENTS

Hereafter, specific embodiments of the present invention will be described in detail with reference to the attached drawings.

Figure 1:
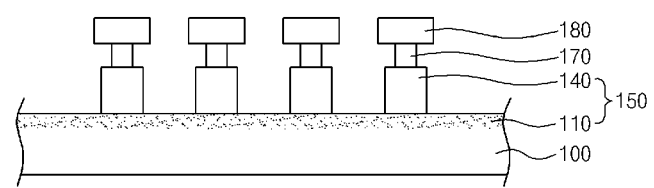
FIG. 1 is a cross-sectional view illustrating a conventional phase change memory device with a PN diode.
Figure 2:
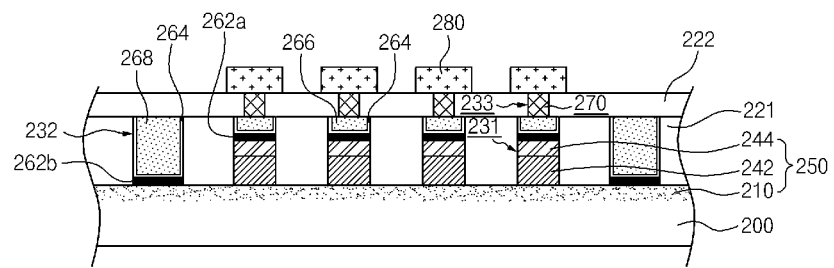
FIG. 2 is a cross-sectional view showing a phase change memory device in accordance with an embodiment of the present invention.

FIG. 2 is a cross-sectional view showing a phase change memory device in accordance with an embodiment of the present invention.

Referring to FIG. 2, a silicon substrate 200 is prepared. The silicon substrate 200 has a bar-type active region that comprises a plurality of phase change cell areas. An N-type impurity region 210 is formed in the surface of the active region of the silicon substrate 200. A first insulation layer 221 is formed on the silicon substrate 200 including the N-type impurity region 210. First contact holes 231 are defined in portions of the first insulation layer 221 corresponding to respective phase change cell areas. Second contact holes 232 are defined in portions of the first insulation layer 221 on both sides of the plurality of phase change cell areas to expose the N-type impurity region 210 formed in the surface of the silicon substrate 200. The second contact holes 232 have a width greater than that of the first contact holes 231.

An N-type silicon layer 242 and a P-type silicon layer 244 are stacked in each first contact hole 231 and the stack is formed such that a recess remains within each first contact hole 231, by which a PN diode 250 comprising the N-type impurity region 210, the N-type silicon layer 242, and the P-type silicon layer 244 is formed. The N-type silicon layer 242 has a concentration lower than that of the N-type impurity region 210. The P-type silicon layer 244 has a concentration higher than that of the N-type silicon layer 242.

Metal silicide layers 262a and 262b are formed on the recessed P-type silicon layer 244 in the first contact holes 231 and on portions of the N-type impurity region 210 exposed by the second contact holes 232, respectively. A thin film for absorbing heat (i.e., a heat sink 266) and a contact plug 268 for a word line are formed both in the first contact hole 231 in which the stack pattern of the N-type silicon layer 242 and the P-type silicon layer 244 and the metal silicide layer 262a are formed, and in the second contact hole 232 in which the metal-silicide layer 262b is formed. The heat sink 266 and the contact plug 268 completely fill the first contact hole 231 and the second contact hole 232 respectively. A barrier layer 264 covers the sidewalls and the bottom wall of the heat sink 266 and the contact plug 268. The heat sink 266 formed in the first contact hole 231 performs the function of quickly cooling the heat transferred to a phase change layer upon reset programming of the phase change memory device. The heat sink 266 and the contact plug 268 are formed of a material having high heat conductivity, and preferably, tungsten or tungsten silicide.

A second insulation layer 222 having a plurality of third contact holes 233 for exposing the heat sinks 266 is formed on the first insulation layer 221 including the heat sinks 266 and the contact plugs 268. Heaters 270 are formed in the third contact holes 233. The heaters 270 are formed of a material having a low reactivity with the phase change layer, for example, any one of a TiW layer, a TiAlN layer and a TiN layer. The heater 270 serves as the bottom electrode and performs the function of transferring the heat generated by current application to the phase change layer. A stack pattern 280 of a phase change layer and a top electrode is formed on each heater 270 and on adjacent portions of the second insulation layer 222 that surround the heater 270. The phase change layer is formed of a material comprising at least one of Ge, Sb, and Te and is doped with at least one of oxygen, nitrogen, and silicon.

As described above, in the phase change memory device according to the present invention, the heat sink is formed between the PN diode switching element and the heater (the heater transfers heat generated by current application to the phase change layer). Accordingly, in the phase change memory device according to the present invention, when a reset current is applied and heat is transferred from the heater to the phase change layer to convert the phase change layer from a crystalline state to an amorphous state (thereby providing a phase change layer with a high reset resistance), the heat sink performs the function of quickly cooling the heat transferred to the phase change layer.

As a result, in the phase change memory device according to the present invention, the heat transferred to the phase change layer can be quickly cooled by the heat sink, and therefore a stable reset resistance can be obtained. Accordingly, the operation characteristics and reliability of the phase change memory device are improved.

FIGS. 3A through 3F are cross-sectional views shown for illustrating the steps in a method for manufacturing a phase change memory device in accordance with an embodiment of the present invention.

Figure 3A:
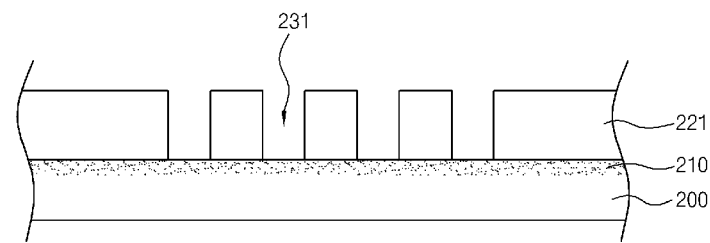
FIGS. 3A through 3F are cross-sectional views shown for illustrating the steps in a method for manufacturing a phase change memory device in accordance with an embodiment of the present invention.

Referring to FIG. 3A, a silicon substrate 200, which has a bar-type active region including a plurality of phase change cell areas, is prepared. An N-type impurity region 210 is formed in the surface of the active region of the silicon substrate 200 by ion-implantation of N-type impurities. The N-type impurity region 210 is formed by ion-implanting P or As N-type impurities using energy in the range of 10~60 keV. A first insulation layer 221 is formed on the silicon substrate 200 having the N-type impurity region 210. The first insulation layer 221 is etched to define first contact holes 231 having a first width. The first contact holes 231 are defined through portions of the first insulation layer 221 which correspond to respective phase change cell areas. The first contact holes 231 are defined to have a width in the range of 100~1,000 Å, and the first contact holes are separated from one another by a distance in the range of 10~2,000 Å. The first contact holes 231 are defined such that they are grouped together, and the number of first contact holes 231 in a group is a multiple of 2. For example, the first contact holes 231 are defined such that two, four or eight (preferably, four first contact holes 231) constitute one group.

Figure 3B:
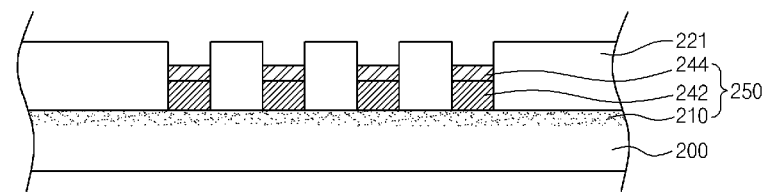

Referring to FIG. 3B, an N-type silicon layer 242 is formed on the portions of the N-type impurity region 210 exposed by the first contact holes 231 using a selective epitaxial growth (SEG) process. At this time, the N-type silicon layer 242 is formed to a thickness that does not completely fill the first contact holes 231 (that is, in such a way as to be recessed in the first contact holes 231). For example, the N-type silicon layer 242 is formed to be recessed to a depth in the range of 100~3,000 Å when measured from the upper ends of the first contact holes 231. The N-type silicon layer 242 is formed to have a concentration lower than the N-type impurity region 210. For example, the N-type silicon layer 242 is formed to have a concentration of $1\times10^{18}$~$1\times10^{20}$ ions/cm$^3$.

P-type impurities are ion-implanted into the N-type silicon layer 242 to form a P-type silicon layer 244 in the upper portion of the N-type silicon layer 242. Through this, PN diodes 250 each comprising a stack pattern of the N-type impurity region 210, the N-type silicon layer 242, and the P-type silicon layer 244 are formed. The P-type silicon layer 244 is formed by ion-implanting B or BF$_2$ as P-type impurities using energy in the range of 10~50 keV. The P-type silicon layer 244 is formed to have a doping concentration higher than that of the N-type silicon layer 242. For example, the P-type silicon layer 244 is formed to have a concentration in the range of $1\times10^{19}$~$1\times10^{22}$ ions/cm$^3$. Since the N-type silicon layer 242 is formed to be recessed to a depth in the range of 100~3,000 Å when measured from the upper ends of the first contact holes 231, the stack pattern of the N-type silicon layer 242 and the P-type silicon layer 244 is also recessed to the depth in the range of 100~3,000 Å when measured from the upper ends of the first contact holes 231.

Figure 3C:
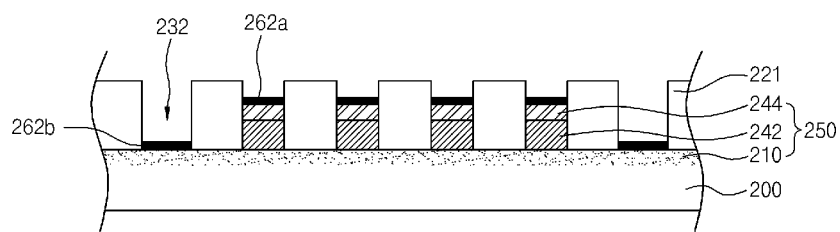

Referring to FIG. 3C, the first insulation layer 221 is etched to define second contact holes 232 on both sides of the phase change cell areas. The second contact holes 232 expose the N-type impurity region 210 of the silicon substrate 200. The second contact holes 232 are respectively defined on both sides of the first contact holes 231 constituting one group (that is, between groups of the first contact holes 231). The second contact holes 232 are formed to have a second width greater than the first width of the first contact holes 231. Accordingly, the second contact holes 232 are defined on sides of the stack pattern of the N-type silicon layer 242 and the P-type silicon layer 244.

A silicide process for the silicon substrate 200 having the second contact holes 232 defined therein is conducted to form metal silicide layers 262a and 262b on the upper surface of the P-type silicon layer 244 formed in the first contact holes 231 and on portions of the N-type impurity region 210 exposed through the second contact holes 232. The metal silicide layers 262a and 262b are formed as a Co silicide layer or a Ti silicide layer and have a thickness in the range of 100~1,000 Å. Here, the metal silicide layer 262a formed on the upper surface of the P-type silicon layer 244 performs the function of improving the ohmic characteristic between subsequently formed heat sinks and the P-type silicon layer 244. The metal silicide layer 262b formed on the bottoms of the second contact holes 232 performs the function of improving the ohmic characteristic between subsequently formed contact plugs and the N-type impurity region 210.

Figure 3D:
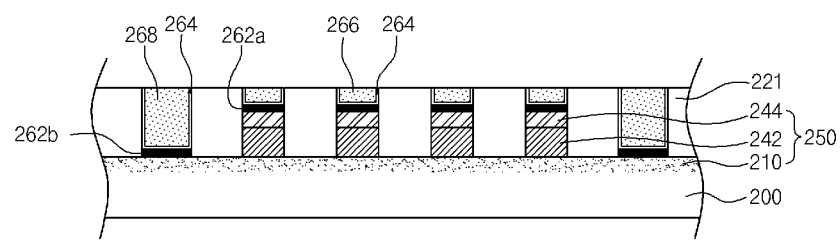

Referring to FIG. 3D, a barrier layer 264 is formed on the first insulation layer 221 and within the first contact holes 231 and the second contact holes 232 in which the metal silicide layers 262a and 262b are formed. The barrier layer 264 is then annealed using a rapid thermal annealing (RTA) process. A conductive layer is formed on the annealed barrier layer 264 to fill the first contact holes 231 and the second contact holes 232. The conductive layer and the barrier layer 264 are CMPed (chemically and mechanically polished) until the first insulation layer 221 is exposed, thereby forming a thin film for absorbing heat (i.e., a heat sink 266) on the barrier layer 264 in each first contact hole 231 and a contact plug 268 for a word line on the barrier layer 264 in each second contact hole 232. Heat sinks 266 and contact plugs 268 are formed of a material having high heat conductivity, and preferably, the heat sinks 266 and contact plugs 268 are formed of tungsten or tungsten silicide.

The heat sinks 266 perform the function of quickly cooling the heat transferred to a subsequently formed phase change layer upon implementation of reset programming in a completely manufactured phase change memory device according to the present invention. The heat sinks 266 are formed simultaneously with the contact plugs 268 for word lines, and accordingly, the formation of the heat sinks 266 does not cause any complexity or difficulties.

Figure 3E:
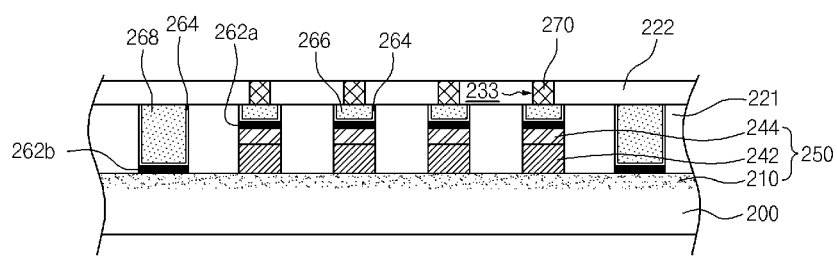

Referring to FIG. 3E, a nitride-based second insulation layer 222 is deposited on the first insulation layer 221 including the heat sinks 266 and the contact plugs 268. The second insulation layer 222 is etched to define third contact holes 233 exposing respective heat sinks 266. A conductive layer is deposited on the second insulation layer 222 to fill the third contact holes 233. The conductive layer is then etched back or CMPed to form heaters 270 in the third contact holes 233. The heaters 270 serve as bottom electrodes and perform the function of reliably transferring heat generated by current application to the phase change layer. The heaters 270 are formed of a material having low reactivity to the phase change layer (for example, any one of a TiW layer, a TiAlN layer and a TiN layer).

Figure 3F:
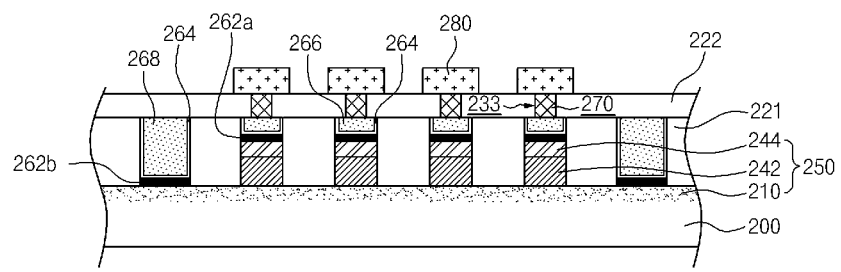

Referring to FIG. 3F, a phase change material and a conductive layer for top electrodes are sequentially deposited on the second insulation layer 222 including the heaters 270. The conductive layer for top electrodes and the phase change material are then etched to form a stack pattern 280 of a phase change layer and a top electrode on each heater 270 and on portions of the second insulation layer 222 adjacent to the heater 270. Here, the stack pattern 280 of the phase change layer and the top electrode is formed in the type of a line extending in a direction perpendicular to the direction of the bar-type active region. The phase change layer is formed of a material comprising at least one of Ge, Sb, and Te. Also, the phase change layer is doped with at least one of oxygen, nitrogen, and silicon.

In the present invention, the phase change layer is formed not only after forming the contact plugs 268, but also after forming the barrier layer 264 and conducting the RTA process. Accordingly, in the present invention it is possible to avoid a thermal attack exerted on a phase change layer, which is typically caused by a contact plug forming process and an RTA process during the manufacturing process of a conventional phase change memory device. Hence, in the present invention, the phase change layer can be formed with a stable phase.

Thereafter, while not shown in the drawings, a series of well-known subsequent processes are sequentially conducted and the manufacturing process of the phase change memory device according to the present invention is complete.

As is apparent from the above description, in the phase change memory device according to the present invention, a heat sink is interposed between a PN diode and a heater. Accordingly, in the phase change memory device according to the present invention, upon reset programming for converting a phase change layer from a crystalline state to an amorphous state (to allow the phase change layer to have a high reset resistance), the heat transferred from the heater to the phase change layer can be quickly cooled. Therefore, by quickly cooling (with the heat sink) the heat transferred to the phase change layer, the phase change memory device according to the present invention can have a stable reset resistance.

While not shown in the drawings, the second contact holes, in which the contact plugs are formed, can be defined before ion-implanting the P-type impurities into the N-type silicon layer.

Although specific embodiments of the present invention have been described for illustrative purposes, those skilled in the art will appreciate that various modifications, additions, and substitutions are possible without departing from the scope and the spirit of the invention as disclosed in the accompanying claims.

What is claimed is:

1. A method for manufacturing a phase change memory device having silicon substrate with a bar-type active region and an N-type impurity region formed in a surface of the active region, comprising the steps of:

forming a first insulation layer on the silicon substrate;
etching the first insulation layer to define a plurality of grouped first contact holes;
forming PN diodes in the first contact holes;
etching the first insulation layer to define second contact holes at sides of the grouped first contact holes;
forming heat sinks in the first contact holes on the PN diodes and forming contact plugs in the second contact holes simultaneously;
forming a second insulation layer having third contact holes exposing the heat sinks on the first insulation layer;
forming heaters in the third contact holes; and
forming stack patterns to contact the heaters, each stack pattern comprising a phase change layer and a top electrode.

2. The method according to claim 1, wherein the number of the grouped first contact holes corresponds to a multiple of 2.

3. The method according to claim 1, wherein the second contact holes are defined to have a width greater than a width of the first contact holes.

4. The method according to claim 1, wherein the PN diodes are formed such that the PN diodes are recessed to a depth in the range of 100~3,000 Å when measured from upper ends of the first contact holes.

5. The method according to claim 1, wherein the PN diodes are formed as a stack pattern comprising an N-type silicon layer and a P-type silicon layer.

6. The method according to claim 5, wherein the step of forming the stack pattern comprising the N-type silicon layer and the P-type silicon layer comprises the steps of:
forming the N-type silicon layer on the N-type impurity region exposed by the first contact holes using a selective epitaxial growth process, such that the N-type silicon layer is recessed in the first contact holes; and
ion-implanting P-type impurities in an upper portion of the N-type silicon layer to form the P-type silicon layer.

7. The method according to claim 6, wherein the N-type silicon layer is formed to have a concentration lower than a concentration of the N-type impurity region.

8. The method according to claim 7, wherein the N-type silicon layer is formed to have a concentration in the range of $1\times10^{18}$~$1\times10^{20}$ ions/cm$^3$.

9. The method according to claim 6, wherein the P-type silicon layer is formed to have a concentration higher than a concentration of the N-type silicon layer.

10. The method according to claim 9, wherein the P-type silicon layer is formed to have a concentration in the range of $1\times10^{19}$~$1\times10^{22}$ ions/cm$^3$.

11. The method according to claim 1, further comprising:
after the step of defining the second contact holes and before the step of forming the heat sinks and the contact plugs,
forming first metal silicide layers on the PN diodes in the first contact holes and forming second metal silicide layers on the N-type impurity region in the second contact holes.

12. The method according to claim 11, wherein the first and second metal silicide layers comprise Co silicide or Ti silicide.

13. The method according to claim 11, further comprising:
after the step of forming the first and second metal silicide layers and before the step of forming the heat sinks and the contact plugs,
forming a barrier layer; and
annealing the barrier layer.

14. The method according to claim 1, wherein the heat sinks and the contact plugs are formed to comprise tungsten or tungsten silicide.

15. The method according to claim 1, wherein the heaters are formed to comprise any one of a TiW layer, a TiAlN layer and a TiN layer.

16. The method according to claim 1, wherein the stack pattern of the phase change layer and the top electrode is formed in a direction perpendicular to the active region.

17. The method according to claim 1, wherein the phase change layer is formed of a material comprising at least one of Ge, Sb, and Te.

18. The method according to claim 17, wherein the phase change layer is doped with at least one of oxygen, nitrogen, and silicon.

19. The method according to claim 1, wherein the step of forming heat sinks in the first contact holes on the PN diodes and forming contact plugs in the second contact holes at the same time comprises the steps of:
forming a conductive layer to fill the first contact holes and the second contact holes; and
CMPing (chemically and mechanically polishing) the conductive layer until the first insulation layer is exposed.

* * * * *